United States Patent
Tian et al.

(10) Patent No.: US 10,204,934 B2
(45) Date of Patent: Feb. 12, 2019

(54) THIN FILM TRANSISTOR, ARRAY SUBSTRATE, METHODS FOR FABRICATING THE SAME, AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Liang Tang, Beijing (CN); Chaobo Zhang, Beijing (CN); Luopeng Chuo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/522,811

(22) PCT Filed: Oct. 21, 2016

(86) PCT No.: PCT/CN2016/102895
§ 371 (c)(1),
(2) Date: Apr. 28, 2017

(87) PCT Pub. No.: WO2017/118158
PCT Pub. Date: Jul. 13, 2017

(65) Prior Publication Data
US 2018/0090521 A1 Mar. 29, 2018

(30) Foreign Application Priority Data
Jan. 5, 2016 (CN) .......................... 2016 1 0003913

(51) Int. Cl.
*H01L 27/12* (2006.01)
*H01L 29/66* (2006.01)
(Continued)

(52) U.S. Cl.
CPC ...... *H01L 27/1248* (2013.01); *H01L 27/1255* (2013.01); *H01L 27/1259* (2013.01);
(Continued)

(58) Field of Classification Search
CPC .......... H01L 27/1248; H01L 29/66757; H01L 29/78675; H01L 27/1262; H01L 29/78633;
(Continued)

(56) References Cited

U.S. PATENT DOCUMENTS

2007/0159565 A1 7/2007 Segawa et al.
2009/0230397 A1* 9/2009 Noda .................. H01L 27/1229
257/59

(Continued)

FOREIGN PATENT DOCUMENTS

CN 101000914 A 7/2007
CN 102800630 A 11/2012
(Continued)

OTHER PUBLICATIONS

Written Opinion from corresponding PCT Application No. PCT/CN2016/102895 dated Jan. 25, 2017.
(Continued)

*Primary Examiner* — Selim Ahmed
(74) *Attorney, Agent, or Firm* — Harness, Dickey & Pierce, P.L.C.

(57) ABSTRACT

The embodiments of the present disclosure relate to an array substrate, a thin film transistor, methods for fabricating the same, and a display device. The method for fabricating the array substrate provided by the embodiments of the present disclosure comprises: forming an active layer on a substrate; forming a gate on the active layer; forming a first insulation layer on the gate; forming a light blocking portion on the first insulation layer, the light blocking portion being arranged above an edge portion of the gate, so that the light blocking portion blocks light entering the active layer from the edge portion of the gate.

17 Claims, 2 Drawing Sheets

(51) Int. Cl.
*H01L 29/786* (2006.01)
*H01L 27/32* (2006.01)

(52) U.S. Cl.
CPC .... *H01L 27/1262* (2013.01); *H01L 29/66757* (2013.01); *H01L 29/78633* (2013.01); *H01L 29/78675* (2013.01); *H01L 27/3272* (2013.01)

(58) Field of Classification Search
CPC ..... H01L 27/3272; H01L 21/77; H01L 27/12; H01L 21/336; H01L 29/786; H01L 27/32
See application file for complete search history.

(56) References Cited

U.S. PATENT DOCUMENTS

| | | | |
|---|---|---|---|
| 2013/0119376 A1* | 5/2013 | Sasagawa | H01L 29/66742 257/43 |
| 2015/0370109 A1* | 12/2015 | Cao | H01L 27/124 257/347 |
| 2016/0036005 A1 | 2/2016 | Qi et al. | |
| 2016/0259190 A1 | 9/2016 | Yan et al. | |

FOREIGN PATENT DOCUMENTS

| | | |
|---|---|---|
| CN | 103337497 | 10/2013 |
| CN | 103700685 | 4/2014 |
| CN | 105470196 | 4/2016 |
| WO | WO-2014205997 A1 | 12/2014 |

OTHER PUBLICATIONS

International Search Report from corresponding PCT Application No. PCT/CN2016/102895 dated Jan. 25, 2017.

Office Action from corresponding Chinese Application No. 201610003913.8 dated Dec. 4, 2017 (8 pages).

* cited by examiner

THIN FILM TRANSISTOR, ARRAY SUBSTRATE, METHODS FOR FABRICATING THE SAME, AND DISPLAY DEVICE

CROSS-REFERENCE TO RELATED APPLICATION

This application claims the benefit and priority of Chinese Patent Application No. 201610003913.8, filed on Jan. 5, 2016, the disclosure of which is incorporated by reference herein in its entirety as part of the present application.

FIELD

The example embodiments of the present disclosure relate to a field of semiconductor technique, and particularly, to a thin film transistor, an array substrate, methods for fabricating the same, and a display device.

BACKGROUND

With the rapid progress of the display technique, the semiconductor element technique is also quickly developed as the core of the display device. In an existing display device, as a current-mode luminescent device, the Organic Light Emitting Diode (OLED) is increasingly applied into the field of high performance display due to its characteristics such as self-emission, quick response, wide viewing angle and being makeable on a flexible substrate.

The OLED may be classified into a Passive Matrix Driving OLED (PMOLED) and an Active Matrix Driving OLED (AMOLED) based on the driving mode. Due to the advantages such as low fabricating cost, high response speed, power saving, suitable for the direct current driving of the portable device, wide range of the working temperature, the AMOLED display is expected to be a new type of two-dimensional display to replace the Liquid Crystal Display (LCD). In the existing AMOLED display panel, each OLED includes a plurality of Thin Film Transistor (TFT) switching circuits, wherein due to the excellent static electrical characteristics, the low temperature poly silicon TFT, as an important electronic devices, has been widely used in the aspects such as liquid crystal display, matrix image sensor.

SUMMARY

The embodiments of the present disclosure provide an array substrate, a thin film transistor, methods for fabricating the same, and a display device, which can reduce the influence of light on the thin film transistor, thereby improving the performance of the thin film transistor.

According to an embodiment of the present disclosure, a method for fabricating an array substrate is provided. The method comprises: forming an active layer on a substrate; forming a gate on the active layer;

forming a first insulation layer on the gate; and forming a light blocking portion on the first insulation layer, the light blocking portion being arranged above an edge portion of the gate, so that the light blocking portion may block light entering the active layer from the edge portion of the gate.

In an embodiment, a projection of the light blocking portion onto the active layer is partially overlapped with a projection of the gate onto the active layer.

In an embodiment, the projection of the light blocking portion onto the active layer has a width no less than 4 μm and no more than 20 μm.

In an embodiment, a portion of the projection of the light blocking portion onto the active layer, which is not overlapped with the projection of the gate onto the active layer, has a width no less than 3 μm.

In an embodiment, forming the gate on the active layer comprises: forming a second insulation layer on the active layer; and forming a first conductive layer on the second insulation layer, wherein the first conductive layer has a first portion that forms the gate.

In an embodiment, forming the light blocking portion on the first insulation layer comprises: forming a second conductive layer on the first insulation layer, wherein the second conductive layer has a second portion that forms the light blocking portion.

In an embodiment, the first conductive layer further has a third portion spaced apart from the first portion, the second conductive layer further has a fourth portion spaced apart from the second portion, and the third portion and the fourth portion are at least partially overlapped with each other in a vertical direction to form a capacitor.

In an embodiment, the second conductive layer further comprises a fifth portion spaced apart from the second portion and the fourth portion, and the fifth portion is used for wiring.

In an embodiment, the active layer is a polycrystalline silicon layer.

Forming the active layer comprises: forming an amorphous silicon layer on the substrate; and converting the amorphous silicon layer into the polycrystalline silicon layer.

According to another embodiment of the present disclosure, a method for fabricating a thin film transistor is provided. The method comprises:

forming an active layer on a substrate;
forming a gate on the active layer;
forming a first insulation layer on the gate;
forming a light blocking portion on the first insulation layer, the light blocking portion being arranged above an edge portion of the gate, so that the light blocking portion may block light entering the active layer from the edge portion of the gate.

In an embodiment, a projection of the light blocking portion onto the active layer is partially overlapped with a projection of the gate onto the active layer.

In an embodiment, the projection of the light blocking portion onto the active layer has a width no less than 4 μm and no more than 20 μm.

In an embodiment, a portion of the projection of the light blocking portion onto the active layer, which is not overlapped with the projection of the gate onto the active layer, has a width no less than 3 μm.

In an embodiment, the active layer is a polycrystalline silicon layer, and forming the active layer comprises: forming an amorphous silicon layer on the substrate; and converting the amorphous silicon layer into the polycrystalline silicon layer.

According to another embodiment of the present disclosure, a thin film transistor is provided. The thin film transistor comprises:

a substrate;
an active layer formed on the substrate;
a gate formed on the active layer;
a first insulation layer formed on the gate; and a light blocking portion formed on the first insulation layer, the light blocking portion being arranged above an edge portion of the gate, so that the light blocking portion may block light entering the active layer from the edge portion of the gate.

In an embodiment, a projection of the light blocking portion onto the active layer is partially overlapped with a projection of the gate onto the active layer.

In an embodiment, the projection of the light blocking portion onto the active layer has a width no less than 4 μm and no more than 20 μm.

In an embodiment, a portion of the projection of the light blocking portion onto the active layer, which is not overlapped with the projection of the gate onto the active layer, has a width not less than 3 μm.

In an embodiment, the light blocking portion is made of one or more of molybdenum, titanium, aluminum and copper.

In an embodiment, the active layer is a polycrystalline silicon layer.

According to still another embodiment of the present disclosure, an array substrate is provided. The array substrate comprises any one of the aforementioned thin film transistors.

In an embodiment, the array substrate further comprises a second insulation layer, and a first conductive layer formed on the second insulation layer and having a first portion that forms the gate.

In an embodiment, the array substrate further comprises a second conductive layer having a second portion that forms the light blocking portion.

In an embodiment, the first conductive layer further has a third portion spaced apart from the first portion, the second conductive layer further has a fourth portion spaced apart from the second portion, and the third portion and the fourth portion are at least partially overlapped with each other in a vertical direction to form a capacitor.

In an embodiment, the second conductive layer further has a fifth portion spaced apart from the second portion and the fourth portion, and the fifth portion is used for wiring.

According to still another embodiment of the present disclosure, a display device is provided. The display device comprises any one of the aforementioned array substrates.

In the embodiments of the present disclosure, a light blocking portion is formed above the edge of the gate of the thin film transistor, which can effectively prevent light (e.g., ultraviolet light used during the fabrication of a device such as the thin film transistor or the array substrate) entering the active region (e.g., the channel region) of the device from the edge of the gate, e.g., due to the diffraction effect at the edge of the gate and thus influencing the whole performance of the device.

DRAWINGS

In order to more clearly illustrate the technical solutions in the embodiments of the present disclosure, the drawings to be used in the descriptions of the embodiments will be briefly described as follows. Obviously, the following drawings just illustrate some embodiments of the present disclosure, and a person skilled in the art can obtain other drawings from them without paying any creative effort.

FIG. 1 schematically illustrates a partial cross section view of an array substrate according to an embodiment of the present disclosure;

FIG. 2 schematically illustrates a partial cross section view of a thin film transistor according to an embodiment of the present disclosure;

DETAILED DESCRIPTION

Figure 1:
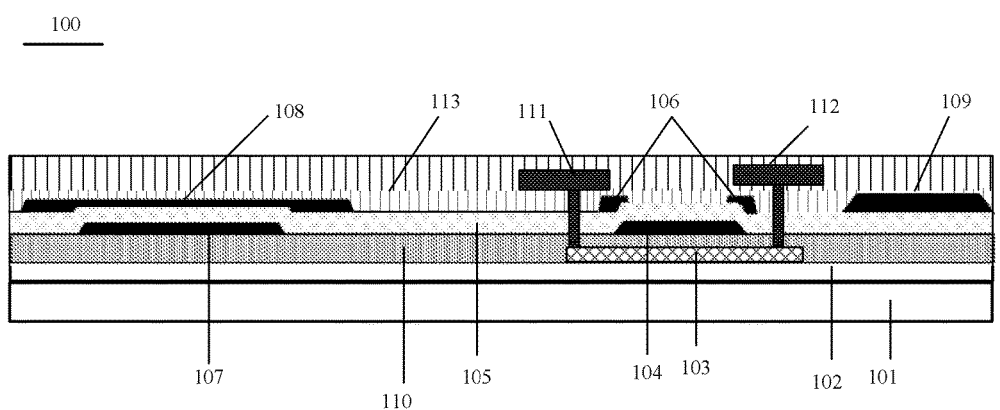

In order that the objectives, technical solutions and advantages of the present disclosure are clearer, the embodiments of the present disclosure will be further described in detail as follows in conjunction with the drawings. It shall be appreciated that those described are just a part of the embodiments of the present disclosure rather than all of the embodiments. Based on the described embodiments of the present disclosure, any other embodiments obtained by a person skilled in the art without paying any creative effort shall fall within the protection scope of the present disclosure.

It also shall be appreciated that various layers and/or regions illustrated in the drawings are not drawn in proportion. Moreover, for the convenience of explanation, only one or more semiconductor layers and/or regions commonly used in such semiconductor devices are explicitly illustrated or described. In particular, for the processing steps, it shall be emphasized that the descriptions provided herein do not intend to include all processing steps which may be required for forming a functional semiconductor device. More precisely, in order to simplify the descriptions, specific processing steps common used in forming the semiconductor device, such as wet cleaning and annealing steps, are intentionally not described herein. However, a person skilled in the art will easily recognize those processing steps omitted in the general descriptions.

In the case that the low-temperature polycrystalline silicon TFT is applied to the OLED display, the active region, particularly the channel region, of the low-temperature polycrystalline silicon TFT will be easily influenced by the illumination. Especially during the process for fabricating the OLED backplane, after the gate is formed, the ultraviolet light used in the source/drain and subsequent process may enter the active region, particularly the channel region, of the thin film transistor, due to diffraction phenomenon at the edge of the gate, which has a great impact on the performance of the thin film transistor, since the low-temperature polycrystalline silicon is unstable. The embodiments of the present disclosure provide an array substrate, a thin film transistor, methods for fabricating the same, and a display device, which can reduce the influence of light on the thin film transistor and improve the performance of the thin film transistor.

FIG. 1 schematically illustrates a partial cross section view of an array substrate according to an embodiment of the present disclosure. Specifically, FIG. 1 illustrates an array substrate 100 according to an embodiment of the present disclosure. The array substrate 100 comprises a substrate 101; an active layer 103 formed on the substrate 101; a gate 104 formed on the active layer 103; a first insulation layer 105 formed on the gate 104 and a light blocking portion 106 formed on the first insulation layer 105, wherein the light blocking portion 106 is arranged above an edge portion of the gate 104, so that the light blocking portion 106 blocks light entering the active layer, particularly a channel region, from the edge portion of the gate 104.

In the embodiments of the present disclosure, a polycrystalline silicon layer may be used as the active layer of the active device (e.g., TFT transistor) in the array substrate. A person skilled in the art will appreciate that the material of the active layer is not limited to the polycrystalline silicon, and it may be any other material suitable to serve as the active layer. It also will be appreciated that the active layer in the embodiments of the present disclosure may comprise a channel region, and a source region and a drain region doped with P-type or N-type doping ions. In the embodiments of the present disclosure, the array substrate further comprises a source 111 and a drain 112 connected to the source region and the drain region through via-holes formed in the insulation layer, respectively.

A person skilled in the art shall appreciate that a buffer layer 102 may be further arranged between the substrate 101 and the active layer 103, as illustrated in FIG. 1. A second insulation layer (i.e., a gate insulation layer 110) may be further arranged between the active layer 103 and the gate 104. Both the gate insulation layer 110 and the buffer layer 102 may be made of silicon nitride, silicon oxide or a combination thereof. In addition, the substrate 101 may be transparent or non-transparent. Optionally, the substrate may be a glass substrate or a plastic substrate.

In an embodiment, the light blocking portion 106 may be disposed above each edge of the gate 104. Moreover, in order that the light blocking portion 106 has a better light blocking effect, the light blocking portion 106 is disposed at a position across the edge of the gate 104 and above the first insulation layer 105, so that a projection of the light blocking portion 106 onto the active layer 103 is partially overlapped with a projection of the gate 104 onto the active layer 103. As an optional embodiment, the projection of the light blocking portion 106 onto the active layer 103 has a width no less than 4 μm and no more than 20 μm. Further optionally, a portion of the projection of the light blocking portion 106 onto the active layer 103, which is not overlapped with the projection of the gate 104 onto the active layer 103, has a width no less than 3 μm. Tests prove that by setting the width of the light blocking portion in the above numerical range, it is more effective to prevent the light entering the active layer, particularly the channel region, due to the diffraction phenomenon at the edge of the gate.

In an embodiment of the present disclosure, the array substrate 100 further comprises a first conductive layer and a second conductive layer, wherein the first conductive layer at least comprises a first portion and a third portion 107 spaced apart from the first portion, and the second conductive layer at least comprises a second portion and a fourth portion 108 spaced apart from the second portion and a fifth portion 109 respectively spaced apart from the second portion and the fourth portion. The first portion forms the gate 104; the second portion forms the light blocking portion 106; the third portion 107 and the fourth portion 108 are at least partially overlapped with each other in a vertical direction to form a capacitor, so as to improve the resolution of the display panel of the array substrate; and the fifth portion may function a wiring region of the semiconductor device. It can be appreciated that the portions comprised by the first conductive layer and the second conductive layer are not limited to those described as above, and more or less portions may be comprised.

In an embodiment, the first conductive layer may be deposited at first, and then be patterned to form the first portion and the third portion thereof. Similarly, the second conductive layer may be deposited at first, and then be patterned to form the second portion, the fourth portion and the fifth portion thereof. It can be appreciated that the method for forming the first portion and the third portion of the first conductive layer, and the method for forming the second portion, the fourth portion and the fifth portion of the second conductive layer are not limited to those described herein. The first conductive layer and the second conductive layer may be made of any electrically conductive material, such as one or more of molybdenum (Mo), titanium (Ti), aluminum (Al) and copper (Cu).

It is to be noted that the layers described herein are not necessarily complete and continuous layer, and may be discontinuous layers composed of one or more portions, such as the first conductive layer having the first portion and the third portion, and the second conductive layer having the second portion, the fourth portion and the fifth portion as described above.

It shall be appreciated that, in the embodiments of the present disclosure, the array substrate may further comprise a dielectric layer 113 configured as a dielectric substance between the conductive components such as the source 111, the drain 112, the fourth portion 108 and the fifth portion 109.

Figure 2:
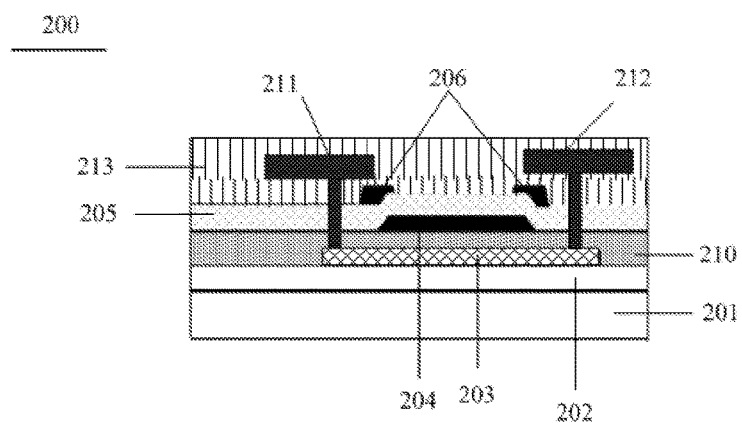

FIG. 2 schematically illustrates a partial cross section view of a thin film transistor according to an embodiment of the present disclosure. The thin film transistor according to this embodiment of the present disclosure may be used in the array substrate described in the above embodiments. As illustrated in FIG. 2, the thin film transistor 200 comprises: a substrate 201; an active layer 203 formed on the substrate 201; a gate 204 formed on the active layer 203; a first insulation layer 205 formed on the gate 204 and a light blocking portion 206 formed on the first insulation layer 205, wherein the light blocking portion 206 is arranged above an edge portion of the gate 204, so that the light blocking portion 206 may block light entering the active layer 203 (e.g., a channel region) from the edge portion of the gate 204.

In the embodiments of the present disclosure, a polycrystalline silicon layer is used as the active layer of the thin film transistor. The active layer in the embodiments of the present disclosure may comprise a channel region, and a source region and a drain region doped with P-type or N-type doping ions.

In addition, it shall be appreciated that, in the embodiments of the present disclosure, the thin film transistor further comprises a source 211 and a drain 212 connected to the source region and the drain region through via-holes formed in the insulation layer, respectively, and a dielectric layer 213 used as a dielectric substance.

A person skilled in the art shall appreciate that the thin film transistor provided by the embodiment of the present disclosure may further comprise a buffer layer 202. The buffer layer 202 is formed on the substrate 201, and the active layer 203 is formed on the buffer layer 202. A gate insulation layer 210 may be arranged between the active layer 203 and the gate 204. Both the gate insulation layer 210 and the buffer layer 202 may be made of silicon nitride, silicon oxide or a combination thereof. The substrate 201 may be transparent or non-transparent. Optionally, the substrate may be a glass substrate or a plastic substrate.

In an embodiment, a projection of the light blocking portion 206 onto the active layer 203 is partially overlapped with a projection of the gate 204 onto the active layer 203. As an optional embodiment, the projection of the light blocking portion 206 onto the active layer 203 has a width no less than 4 μm and no more than 20 μm. Further optionally, a portion of the projection of the light blocking portion 206 onto the active layer 203, which is not overlapped with the projection of the gate 204 onto the active layer 203, has a width no less than 3 μm. Tests prove that by setting the size parameters of the light blocking portion, it is more effective to prevent the light, due to the diffraction phenomenon at the edge of the gate, entering the active layer, particularly the channel region.

In the thin film transistor provided by this embodiment of the present disclosure, the light blocking portion is disposed above the edge of the gate, which may block the light entering the active layer, particularly the channel region, of the thin film transistor due to the diffraction effect of the light. If the thin film transistor is applied to devices such as the display, the performance of those devices may be greatly improved.

Figure 3:
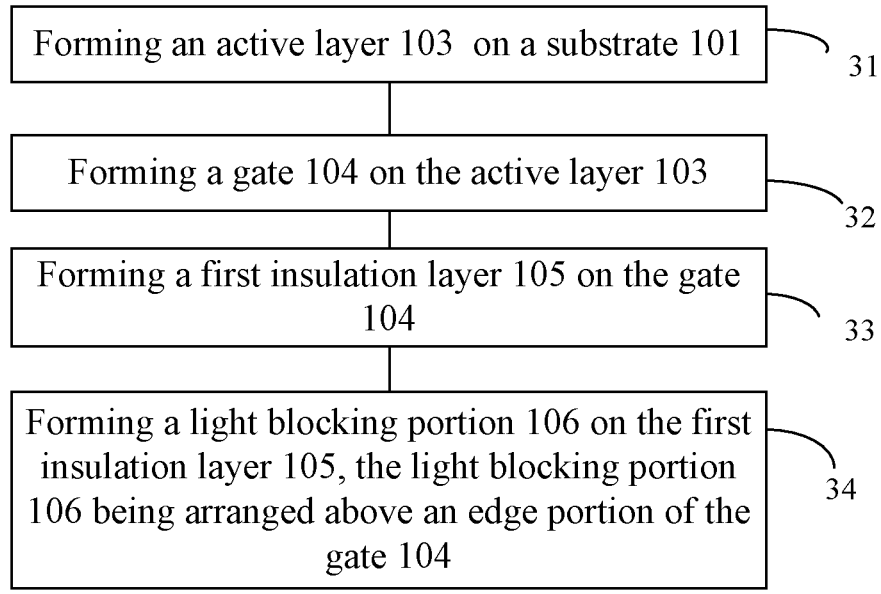
FIG. 3 illustrates a flowchart of a method for fabricating an array substrate according to an embodiment of the present disclosure.

FIG. 3 schematically illustrates a flowchart of a method for fabricating an array substrate according to an embodiment of the present disclosure.

It is to be noted, the method for fabricating the array substrate provided by this embodiment of the present disclosure corresponds to the array substrate provided by the aforementioned embodiments. Thus the explanations for the layers and/or regions of the array substrate in the aforementioned embodiments are also suitable to the method for fabricating the array substrate provided by this embodiment. The method comprises the following steps S31-S34.

At S31, an active layer 103 is formed on a substrate 101.

A person skilled in the art will appreciate that the active layer 103 may be directly formed on the substrate 101. Alternatively, a buffer layer 102 may be formed between the substrate 101 and the active layer 103.

Wherein, the substrate 101 may be a glass substrate, and the buffer layer 102 may be formed by depositing a material such as nitride, oxide or a combination thereof on the substrate. Optionally, the active layer may be a polycrystalline silicon layer. An amorphous silicon layer may be formed on the substrate or the buffer layer, and then converted into a polycrystalline silicon layer through for example an excimer laser annealing process. The material of the gate insulation layer may also be nitride, oxide, etc. It can be appreciated that the methods and materials for forming the substrate, the buffer layer, and the active layer, etc. are not limited to those described herein, and other methods and materials in the art are possible.

At S32, a gate 104 is formed on the active layer 103.

In the embodiment of the present disclosure, the gate may be formed by:

forming a first conductive layer on the active layer 103, and then patterning the first conductive layer to form a first portion thereof, so that the first portion forms the gate 104.

It can be appreciated that before the first conductive layer is deposited, the gate insulation layer 110 may be formed on the active layer, and then the first conductive layer may be formed on the gate insulation layer 110.

As described above, in an embodiment of the present disclosure, while the first conductive layer is patterned after the first conductive layer is deposited, a third portion 107 of the first conductive layer may be formed so that the third portion 107 serves as an electrode of a capacitor in the array substrate, wherein the third portion 107 and the first portion 104 are spaced apart from each other. By patterning the first conductive layer, the first portion 104 and the third portion 107 are formed simultaneously, thereby simplifying the fabricating process and saving time. It can be appreciated that the first portion 104 and the third portion 107 also may be formed in different steps, but formed separately and orderly.

AS33, a first insulation layer 105 is formed on the gate 104.

In this embodiment, the first insulation layer may be formed by depositing an insulation material on the gate, and the first insulation layer may be patterned upon demand to form the expected shape.

AS34, a light blocking portion 106 is formed on the first insulation layer 105. The light blocking portion 106 is arranged on an edge portion of the gate 104, so that the light blocking portion 106 may block light entering the active layer, particularly a channel region, from the edge portion of the gate 104.

As described above, in the embodiments of the present disclosure, the light blocking portion 106 may be formed by:

depositing a second conductive layer on the first insulation layer 105, and then patterning (e.g., etching) the second conductive layer to form a second portion thereof, so that the second portion forms the light blocking portion 106.

As described above, in one embodiment of the present disclosure, while the second conductive layer is patterned after the second conductive layer is deposited, a fourth portion 108 and a fifth portion 109 of the second conductive layer may be formed, wherein the second portion, the fourth portion 108 and the fifth portion 109 are spaced apart from each other, and the fourth portion 108 and the third portion 107 are at least partially overlapped with each other in a vertical direction, so that the fourth portion 108 serves as the other electrode of the capacitor in the array substrate, and the fifth portion 109 serves as a wiring portion for wiring. In this embodiment, by patterning the second conductive layer, the second portion, the fourth portion and the fifth portion are formed simultaneously, thereby simplifying the fabricating process. It can be appreciated that the second portion, the fourth portion and the fifth portion also may be formed in different steps.

In an embodiment, a projection of the light blocking portion 106 onto the active layer 103 is partially overlapped with a projection of the gate 104 onto the active layer 103. Optionally, the projection of the light blocking portion 106 onto the active layer 103 has a width no less than 4 μm and no more than 20 μm. Optionally, a portion of the projection of the light blocking portion 106 onto the active layer 103, which is not overlapped with the projection of the gate 104 onto the active layer 103, has a width no less than 3 μm. Moreover, in the embodiments of the present disclosure, the shape and thickness of the light blocking portion 106 are not specifically limited.

A person skilled in the art will appreciate that in the embodiments of the present disclosure, after the light blocking portion 106 is formed, it may be continued to perform other processing steps of the array substrate to form other layers and/or component required by the array substrate, e.g., those known to a person skilled in the art, such as a source 111, a drain 112, a dielectric layer 113, a flattened layer, a pixel layer, a pixel definition layer, an interlayer spacer.

It is to be noted, in this step, any material and method suitable for forming those layers and/or components may be used for the formation thereof, and they are omitted herein.

Figure 4:
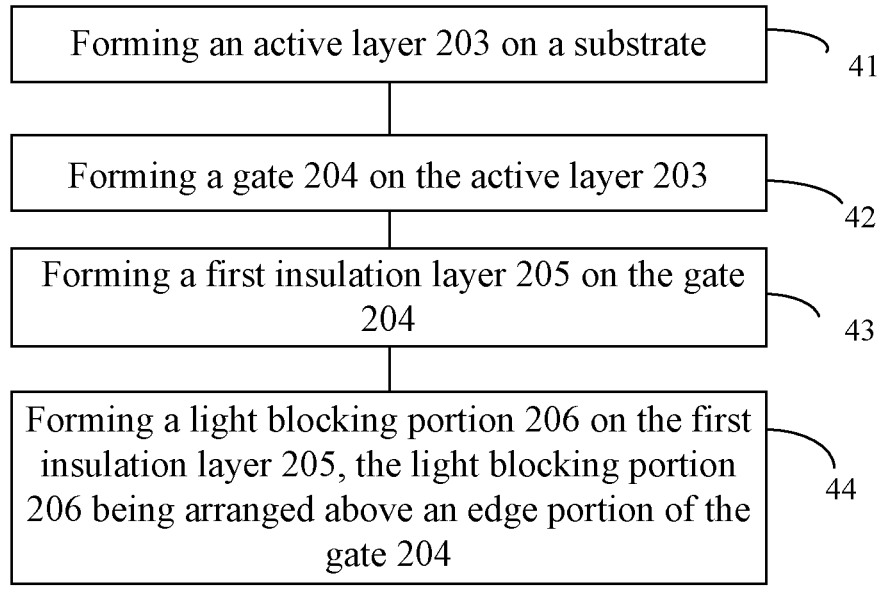
FIG. 4 illustrates a flowchart of a method for fabricating a thin film transistor according to an embodiment of the present disclosure.

FIG. 4 schematically illustrates a flowchart of a method for fabricating a thin film transistor according to an embodiment of the present disclosure.

It is to be noted that the method for fabricating the thin film transistor provided by this embodiment of the present disclosure corresponds to the thin film transistor provided by the aforementioned embodiment. Thus the descriptions of the layers and/or regions of the thin film transistor in the aforementioned embodiments are also adaptive to the method for fabricating the thin film transistor provided by this embodiment. The method comprises the following steps S41-S44.

At S41: an active layer 203 is formed on a substrate.

The active layer may be a polycrystalline silicon layer, into which an amorphous silicon layer may be converted through for example an excimer laser annealing process.

At S42, a gate 204 is formed on the active layer 203.

In an embodiment, the gate 204 may be formed by forming a gate insulation layer 210 on the active layer, forming a gate layer on the gate insulation layer 210, and then patterning the gate layer.

At S43, a first insulation layer 205 is formed on the gate 204.

At S44, a light blocking portion 206 is formed on the first insulation layer 205. The light blocking portion 206 is arranged on an edge portion of the gate 204, so that the light blocking portion 206 may block light entering the active layer (e.g., a channel region) from the edge portion of the gate 204.

A person skilled in the art will appreciate that, in the embodiments of the present disclosure, after the light blocking portion 206 is formed, it may be continued to perform other processing steps to form other layers, regions or components required by the thin film transistor, such as a source 211, a drain 212, a dielectric layer 213. It is to be noted, any method and material known in the art and adaptive to form the source 211, the drain 212, and the dielectric layer 213 may be adopted to form the same.

According to another embodiment of the present disclosure, a display device is provided. The display device comprises the aforementioned array substrate. The display device can prevent the ambient light from influencing performance of the thin film transistor in the array substrate.

It is to be noted, in the descriptions of the present disclosure, the orientations and positional relations indicated by the terms 'on', 'above', 'under', 'below', 'top', 'bottom', 'between', etc. are those illustrated based on the drawings, just for facilitating the descriptions of the present disclosure and simplifying the descriptions, rather than specifying or implying that the concerned apparatuses or elements must have particular orientations, or configured and operated in particular orientations, and hence cannot be understood as limitations to the present disclosure. In addition, when an element or layer is referred to as being 'on/above' another element or layer, it may be directly located on the another element or layer, or there may be an intermediate element or layer; similarly, when an element or layer is referred to as being 'under/below' another element or layer, it may be directly located under the another element or layer, or there may be at least one intermediate layer or element; and when an element or layer is referred to as being 'between' two elements or layers, it may be an unique element or layer between the two elements or layers, or there may be more than one intermediate element or layer.

Further to be noted, when the elements and the embodiments of the present disclosure are introduced, the articles 'a/an', 'one', 'the' and 'said' are intended to represent the existence of one or more elements. Unless otherwise specified, 'a plurality of' means two or more. The expressions 'comprise', 'include', 'contain' and 'have' are intended as inclusive and mean that there might be other elements besides those listed. The terms 'first', 'second', 'third', etc. are only used for the purpose of description, rather than indicating or implying any relative importance or formation order.

These descriptions are just preferred embodiments of the present disclosure, rather than limitations to the present disclosure. Any amendment, equivalent replacement, improvement, etc. made within the spirit and the principle of the present disclosure shall fall within the protection scope of the present disclosure.

The invention claimed is:

1. A thin film transistor comprising:
   a substrate;
   an active layer positioned on the substrate;
   a gate positioned on the active layer, the gate including one or more edge portions;
   a first insulation layer positioned on the gate; and
   a light blocking portion positioned on the first insulation layer, the light blocking portion being arranged only above the one or more edge portions of the gate to block light from entering the active layer from the one or more edge portions of the gate.

2. The thin film transistor according to claim 1, wherein a projection of the light blocking portion onto the active layer is partially overlapped with a projection of the gate onto the active layer.

3. The thin film transistor according to claim 2, wherein the projection of the light blocking portion onto the active layer has a width no less than 4 µm and no more than 20 µm.

4. The thin film transistor according to claim 3, wherein a portion of the projection of the light blocking portion onto the active layer, which is not overlapped with the projection of the gate onto the active layer, has a width no less than 3 µm.

5. The thin film transistor according to claim 1, wherein the active layer is a polycrystalline silicon layer.

6. An array substrate comprising one or more conductive layers and the thin film transistor according to claim 1.

7. The array substrate according to claim 6, further comprising a second insulation layer and a first conductive layer positioned on the second-insulation layer, the first conductive layer having a first portion, wherein the first portion forms the gate.

8. The array substrate according to claim 7, further comprising a second conductive layer having a second portion, wherein the second portion forms the light blocking portion.

9. A display device, comprising the array substrate according to claim 6.

10. An array substrate comprising one or more conductive layers and a thin film transistor, the thin film transistor including a substrate, an active layer positioned on the substrate, a gate positioned on the active layer, a first insulation layer positioned on the gate, a light blocking portion positioned on the first insulation layer, a second insulation layer, a first conductive layer positioned on the second insulation layer and having a first portion and a third portion, and a second conductive layer having a second portion and a fourth portion, the light blocking portion being arranged above an edge portion of the gate to block light from entering the active layer from the edge portion of the gate, wherein the first portion forms the gate, wherein the second portion forms the light blocking portion, wherein the third portion is spaced apart from the first portion, wherein the fourth portion is spaced apart from the second portion, and wherein the third portion and the fourth portion are at least partially overlapped with each other in a vertical direction to form a capacitor.

11. The array substrate according to claim 10, wherein the second conductive layer includes a fifth portion spaced apart from the second portion and the fourth portion.

12. A method for fabricating an array substrate, the method comprising:
   forming an active layer on a substrate;
   forming a gate on the active layer;
   forming a first insulation layer on the gate; and
   forming a light blocking portion on the first insulation layer so that the light blocking portion is arranged only above one or more edge portions of the gate to block light from entering the active layer from the one or more edge portions of the gate.

13. The method according to claim 12, wherein forming the light blocking portion on the first insulation layer comprises forming the light blocking portion on the first insulation layer so that a projection of the light blocking portion onto the active layer partially overlaps a projection of the gate onto the active layer.

14. The method according to claim 12, wherein forming the gate on the active layer comprises:
   forming a second insulation layer on the active layer; and
   forming a first conductive layer on the second insulation layer, wherein the first conductive layer has a first portion that forms the gate.

15. The method according to claim 14, wherein forming the light blocking portion on the first insulation layer comprises:
   forming a second conductive layer on the first insulation layer, wherein the second conductive layer has a second portion that forms the light blocking portion.

16. The method according to claim 15, wherein forming the first conductive layer on the second insulation layer comprises forming the first conductive layer so that a third portion of the first conductive layer is spaced apart from the first portion, and wherein forming the second conductive layer on the first insulation layer comprises forming the second conductive layer so that a fourth portion of the second conductive layer is spaced apart from the second portion, the method further comprising at least partially overlapping the third portion and the fourth portion with each other in a vertical direction to form a capacitor.

17. The method according to claim 12, wherein the active layer is a polycrystalline silicon layer, and wherein forming the active layer comprises:
   forming an amorphous silicon layer on the substrate; and
   converting the amorphous silicon layer into the polycrystalline silicon layer.

* * * * *